(12) United States Patent
Hill et al.

(10) Patent No.: US 11,118,903 B2
(45) Date of Patent: Sep. 14, 2021

(54) EFFICIENT ILLUMINATION SHAPING FOR SCATTEROMETRY OVERLAY

(71) Applicant: KLA-Tencor Corporation, Milpitas, CA (US)

(72) Inventors: Andrew V. Hill, Berkley, CA (US); Dmitry Gorelik, Migdal Ha'emek (IL)

(73) Assignee: KLA Corporation, Milpitas, CA (US)

( * ) Notice: Subject to any disclaimer, the term of this patent is extended or adjusted under 35 U.S.C. 154(b) by 2 days.

(21) Appl. No.: 16/275,085

(22) Filed: Feb. 13, 2019

(65) Prior Publication Data
US 2020/0124408 A1    Apr. 23, 2020

Related U.S. Application Data

(60) Provisional application No. 62/746,987, filed on Oct. 17, 2018.

(51) Int. Cl.
| | |
|---|---|
| *G03F 7/20* | (2006.01) |
| *G01B 11/27* | (2006.01) |
| *G02F 1/33* | (2006.01) |

(52) U.S. Cl.
CPC ............ *G01B 11/272* (2013.01); *G02F 1/33* (2013.01); *G03F 7/70633* (2013.01)

(58) Field of Classification Search
CPC ... G01B 11/26–272; G02F 1/33; G02F 1/332; G02F 1/29; G02F 1/11; G02F 1/113; G01N 2015/1447; G01N 2015/145; G01N 2015/1454; G01N 2201/067; G01N 21/1702; G01N 21/9501; G01N 21/8806; G01N 21/8845; G01J 3/1256; G03F 7/70; G03F 7/70616; G03F 7/70633;

(Continued)

(56) References Cited

U.S. PATENT DOCUMENTS 4,947,047 A * 8/1990 Muraki ............... G03F 7/70558
                                                                250/205
5,002,348 A * 3/1991 Wolf ..................... G02B 26/10
                                                             250/201.1

(Continued)

FOREIGN PATENT DOCUMENTS

KR    20160066562 A    6/2016

OTHER PUBLICATIONS

International Search Report dated Jan. 31, 2020 for PCT/US2019/056167.

*Primary Examiner* — Christina A Riddle
(74) *Attorney, Agent, or Firm* — Suiter Swantz pc llo

(57) ABSTRACT

A multipole illumination system may include an illumination source to generate a source beam, one or more acousto-optic deflectors to diffract the source beam along at least two directions; one or more collection lenses to collect at least some of the diffracted light from the one or more acousto-optic deflectors, and a controller to generate one or more drive signals for the one or more acousto-optic deflectors. For example, the one or more drive signals may cause the one or more acousto-optic deflectors to generate a symmetric distribution of two or more illumination beams formed from light diffracted from the one or more acousto-optic deflectors and collected by the one or more collection lenses, where a distribution of wavelength and intensity of the two or more illumination beams is symmetric in a plane formed by the first and second directions.

36 Claims, 11 Drawing Sheets

(58) Field of Classification Search
CPC ........ G03F 7/7085; G03F 9/70; G03F 9/7003;
G03F 9/7049; G03F 9/7065; G03F
9/7069; G03F 9/7092
USPC ............... 355/52, 53, 55, 67–71, 72, 75, 77;
356/399–401, 58.5, 402; 359/285, 286,
359/287, 298, 304–314; 250/492.1,
250/492.2, 206–206.3, 226, 578.1
See application file for complete search history.

(56) References Cited

U.S. PATENT DOCUMENTS

| | | | | |
|---|---|---|---|---|
| 5,171,999 | A | * | 12/1992 | Komatsu ............... G03F 9/7049 |
| | | | | 250/548 |
| 5,488,230 | A | * | 1/1996 | Mizutani ............... G03F 9/7049 |
| | | | | 250/548 |
| 5,801,389 | A | * | 9/1998 | Mizutani ............... G03F 9/7076 |
| | | | | 250/548 |
| 2004/0066517 | A1 | | 4/2004 | Huang et al. |
| 2006/0197951 | A1 | | 9/2006 | Frommer et al. |
| 2006/0274312 | A1 | * | 12/2006 | Endo ................... G03F 7/70633 |
| | | | | 356/400 |
| 2007/0272885 | A1 | * | 11/2007 | Yamashita ......... G02B 21/0076 |
| | | | | 250/585 |
| 2010/0091284 | A1 | | 4/2010 | Mieher et al. |
| 2011/0085726 | A1 | * | 4/2011 | Den Boef ............. G03F 9/7065 |
| | | | | 382/151 |
| 2014/0133011 | A1 | * | 5/2014 | Schwedt ............ G02B 21/0032 |
| | | | | 359/298 |
| 2014/0204454 | A1 | * | 7/2014 | Li .......................... G02B 26/10 |
| | | | | 359/305 |
| 2015/0136976 | A1 | | 5/2015 | Matsuoka |

\* cited by examiner

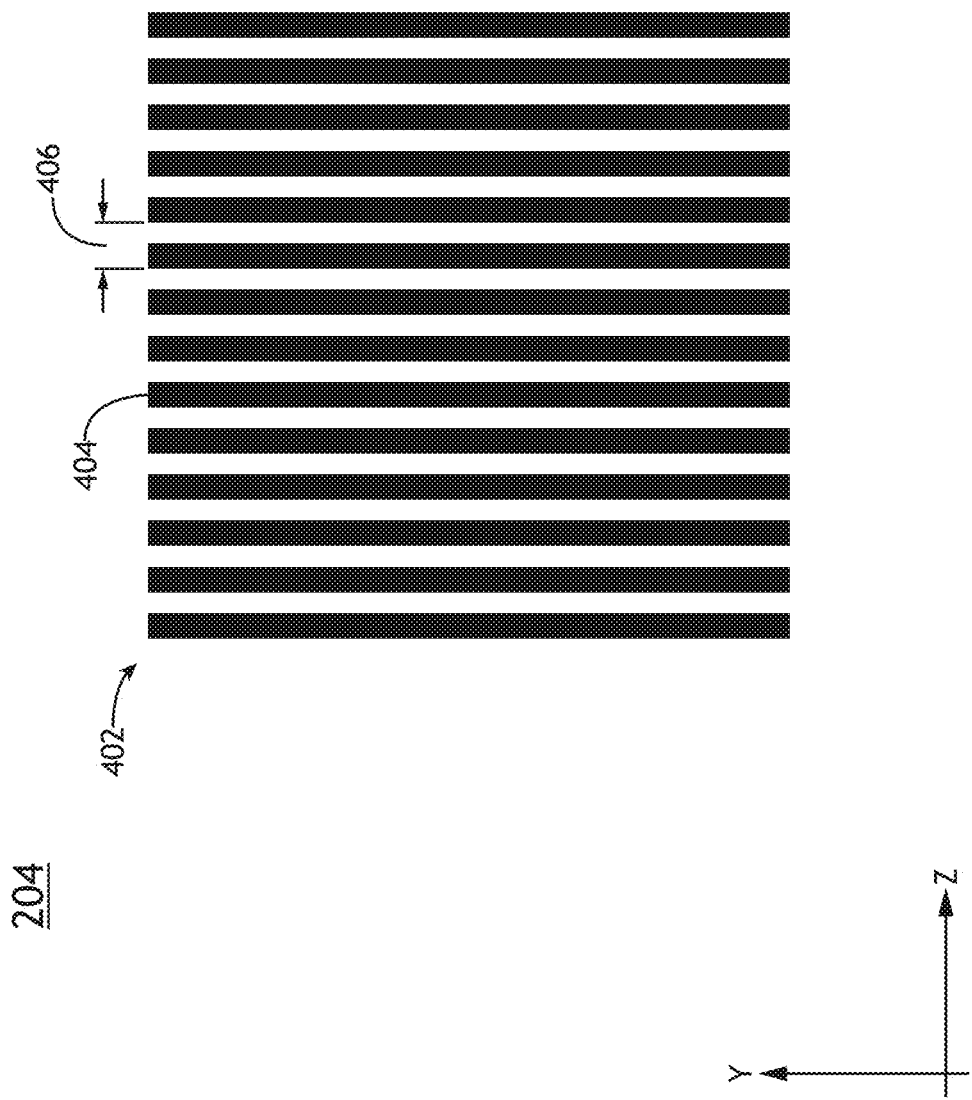

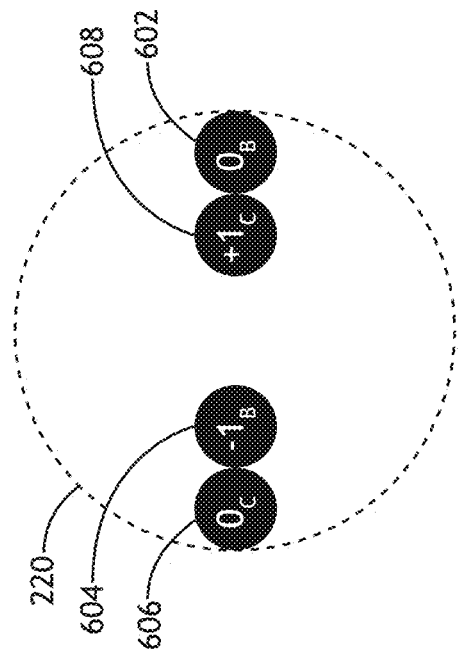
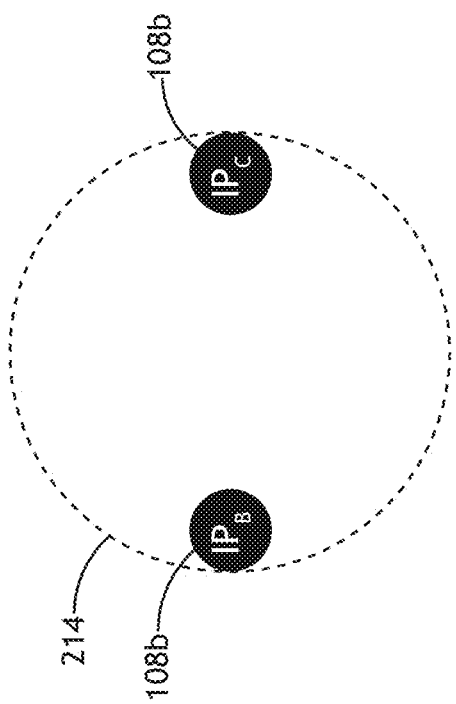
FIG. 6B
FIG. 6A

US 11,118,903 B2

EFFICIENT ILLUMINATION SHAPING FOR SCATTEROMETRY OVERLAY

CROSS-REFERENCE TO RELATED APPLICATION

The present application claims the benefit under 35 U.S.C. § 119(e) of U.S. Provisional Application Ser. No. 62/746,987 filed Oct. 17, 2018, entitled EFFICIENT ILLUMINATION SHAPING FOR SCATTEROMETRY OVERLAY, naming Andrew Hill and Dmitry Gorelik as inventors, which is incorporated herein by reference in the entirety.

TECHNICAL FIELD

The present disclosure relates generally to scatterometry overlay systems and, more particularly, to illumination in scatterometry overlay systems.

BACKGROUND

Scatterometry overlay metrology systems determine overlay errors between sample layers by comparing relative intensities of opposing diffraction orders by overlay targets including stacked grating structures on sample layers of interest. For example, a scatterometry metrology system may direct one or more illumination beams, or illumination poles, to a sample at selected angles. Diffracted light from the grating structures may then be captured for analysis.

It is typically desirable to illuminate the sample with high-power illumination poles with high beam quality (e.g., high-brightness illumination) having narrow-band spectra to generate well-defined diffraction patterns by the grating structures suitable for accurate analysis. Further, it may be desirable to adjust the incident angles and/or wavelengths of the illumination poles on the sample to optimize the collection of diffracted light for a given overlay target configuration. For example, the angle of diffracted light from a grating structure depends on multiple factors including the illumination wavelength, the incident illumination angle, and the pitch of the grating structure. Accordingly, adjusting the illumination angle and/or wavelength based on the overlay target configuration may facilitate capture of opposing diffraction orders for analysis.

However, illumination systems for scatterometry overlay metrology typically suffer from limited brightness or adjustment times of the illumination angle or wavelength, which may limit the accuracy or throughput of the overlay measurements. It may thus be desirable to provide systems and methods for curing the above deficiencies.

SUMMARY

A multipole illumination system is disclosed in accordance with one or more illustrative embodiments of the present disclosure. In one illustrative embodiment, the system includes an illumination source to generate a source beam. In another illustrative embodiment, the system includes one or more acousto-optic deflectors to diffract the source beam along at least a first direction and a second direction different than the first direction. In another illustrative embodiment, the system includes one or more collection lenses to collect at least some of the diffracted light from the one or more acousto-optic deflectors. In another illustrative embodiment, the system includes a controller communicatively coupled to the one or more acousto-optic deflectors. In another illustrative embodiment, the controller generates one or more drive signals for the one or more acousto-optic deflectors. In another illustrative embodiment, the one or more drive signals cause the one or more acousto-optic deflectors to generate a symmetric distribution of two or more illumination beams formed from light diffracted from the one or more acousto-optic deflectors and collected by the one or more collection lenses. In another illustrative embodiment, a distribution of wavelength and intensity of the two or more illumination beams is symmetric in a plane formed by the first and second directions.

An overlay metrology system is disclosed, in accordance with one or more illustrative embodiments of the present disclosure. In one illustrative embodiment, the system includes an illumination source to generate a source beam. In another illustrative embodiment, the system includes one or more acousto-optic deflectors to diffract light along a first direction. In another illustrative embodiment, the system includes an objective lens, wherein the objective lens directs at least some of the diffracted light as two or more illumination beams from the one or more acousto-optic deflectors to a sample. In another illustrative embodiment, the system includes a detector configured to capture light from the sample in response to the two or more illumination beams to generate a measurement signal. In another illustrative embodiment, the system includes a controller communicatively coupled to the first acousto-optic deflector, the second acousto-optic deflector, and the detector. In another illustrative embodiment, the controller generates one or more drive signals for the one or more acousto-optic deflectors. In another illustrative embodiment, the one or more drive signals cause the one or more acousto-optic deflectors to generate a symmetric distribution on the sample of the two or more illumination beams formed from light diffracted from the one or more acousto-optic deflectors and collected by the objective lens. In another illustrative embodiment, a distribution of wavelength and intensity of the two or more illumination beams is symmetric with respect to the first direction. In another illustrative embodiment, the controller determines a metrology measurement of the sample based on the measurement signal.

A method for scatterometry overlay determination is disclosed in accordance with one or more illustrative embodiments of the present disclosure. In one illustrative embodiment, the method includes generating a source beam. In another illustrative embodiment, the method includes diffracting the source beam along at least a first direction and a second direction different than the first direction with one or more acousto-optic deflectors. In another illustrative embodiment, the method includes directing at least some of the diffracted light from the one or more acousto-optic deflectors as two or more illumination beams to a sample. In another illustrative embodiment, the method includes generating one or more drive signals for the one or more acousto-optic deflectors to provide the two or more illumination beams on a sample at a symmetric distribution of incident angles. In another illustrative embodiment, a distribution of wavelength and intensity of the two or more illumination beams is symmetric with respect to the first and second directions. In another illustrative embodiment, the method includes capturing light from the sample in response to the illumination beams to generate a measurement signal. In another illustrative embodiment, the method includes determining a metrology measurement of the sample based on the measurement signal.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 4 is a top view of an overlay metrology target on a sample, in accordance with one or more embodiments of the present disclosure.

FIG. 6A is a top view of an illumination pupil including two illumination poles symmetrically positioned along edges of the illumination pupil for oblique illumination, in accordance with one or more embodiments of the present disclosure.

FIG. 6B is a top view of a collection pupil associated with return light from the overlay metrology target of FIG. 4 in response to the illumination pupil of FIG. 6A, in accordance with one or more embodiments of the present disclosure.

DETAILED DESCRIPTION

Figure 1A:
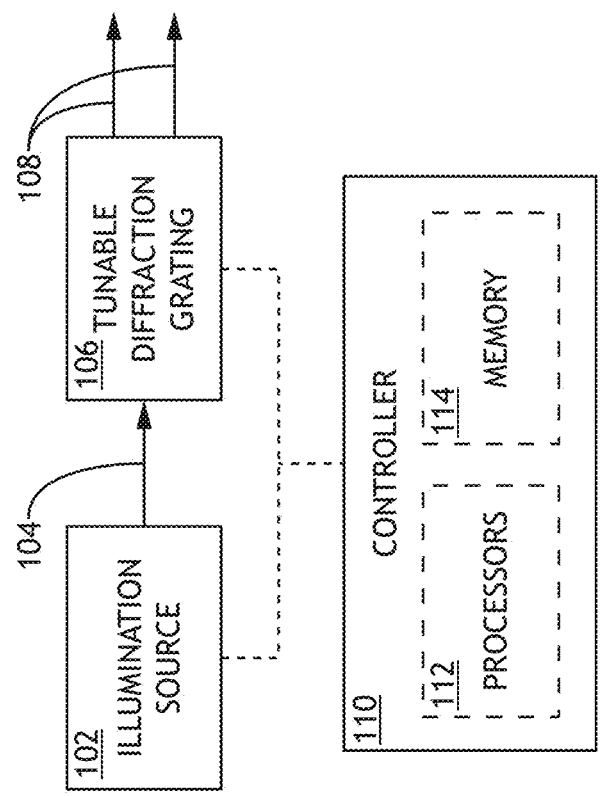
FIG. 1A is a conceptual view of a tunable multi-pole illumination system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for providing high-brightness illumination with a rapidly-configurable illumination profile.

It is recognized herein that scatterometry overlay metrology systems typically direct one or more illumination beams to an overlay metrology target on a sample including diffraction gratings on sample layers of interest and determining registration errors between the layers of interest by comparing intensities of opposing diffraction orders (e.g., +/−1 diffraction orders). The diffraction angles from the overlay target may be characterized by the grating equation and generally depend on the illumination wavelength, the angle of incident illumination, the periods of the grating structures of the overlay target. Accordingly, various illumination distributions may be used to ensure that opposing diffraction orders generated by a selected overlay target and an illumination source with a selected wavelength are captured by the system (e.g., in a collection pupil) for analysis. In some cases, a single illumination pole incident on a sample at normal incidence may be sufficient to generate opposing diffraction orders within the collection pupil. However, this may not be possible for all desired combinations of illumination wavelength and overlay target period. In some cases, a sample is illuminated with two symmetric illumination poles at oblique angles. Accordingly, a first diffraction order (e.g., a +1 diffraction order) may be associated with a first illumination pole, and a second diffraction order (e.g., a −1 diffraction order) may be associated with a second illumination pole.

Embodiments of the present disclosure are directed to generating a high-brightness multi-pole illumination system providing two or more illumination poles in which the illumination poles are formed as diffraction orders of an illumination source beam. For example, a high-brightness multi-pole illumination system may include a narrow-band illumination source to generate a source beam and one or more tunable diffraction gratings (e.g., acousto-optic deflectors (AODs), or the like). In this regard, the tunable diffraction gratings may split the source beam into any selected number of diffracted orders, which may form illumination poles suitable for illuminating a sample at any number of selected angles.

The measurement time associated with a given metrology measurement may depend on interrelated factors including, but not limited to, the brightness of the illumination source and detector sensitivity, or switching speed associated with any adjustments to illumination angle and/or wavelength between successive measurements. Illumination brightness is generally a measure of source quality and relates to both power and beam quality such that a high-brightness source may provide both high power and high beam quality. Accordingly, increasing the brightness of the illumination source may improve system performance by either increasing the signal to noise ratio of a measurement within a given measurement time or by decreasing the measurement time required for a given signal to noise ratio to increase system throughput.

It is recognized herein that forming illumination poles from diffraction orders of a source illumination beam may provide high-brightness illumination poles by efficiently directing the power of an illumination source into selected diffraction orders. Additionally, Gaussian beam profiles associated with many laser systems may closely match a typical apodised beam profile. It is further recognized herein that forming illumination poles from diffraction orders of an illumination source beam may reduce or eliminate the need for apertures and/or apodizers to generate a desired illumination distribution, which reduces the overall brightness by blocking portions of the source beam and may degrade the beam profile of the illumination poles by introducing diffraction effects. For instance, Gaussian profile associated with many lasers may closely match a typical apodised beam profile such that apodization may be reduced or potentially eliminated compared to aperture-based beam forming and shaping.

Additional embodiments of the present disclosure are directed to splitting a source illumination beam with a tunable diffraction grating to provide rapid adjustment of the illumination distribution. For example, the source beam may be, but is not required to be, split using one or more acousto-optic deflectors. In this regard, the switching time between different illumination pupil distributions may be governed at least in part by the switching speed of tunable diffraction gratings. It is recognized herein that the switching time of tunable diffraction gratings may be substantially faster than the switching time associated with adjusting a physical beam block or aperture. For example, switching times of acousto-optic modulators may be on the order of microseconds or shorter. However, it is to be understood that the use of acousto-optic deflectors is provided herein for illustrative purposes only and should not be interpreted as limiting. Rather, systems and methods described herein may include any type of tunable diffraction grating with any switching speed.

Additional embodiments of the present disclosure are directed to generating illumination poles in orthogonal directions. For example, one or more illumination poles in each of two orthogonal directions may be suitable for characterizing overlay targets of any orientation.

Additional embodiments of the present disclosure are directed to generating symmetric illumination poles having equal intensities to facilitate a comparison of the intensities of the associated opposing diffraction orders. For example, a source beam may be, but is not required to be, diffracted by one or more diffraction gratings in a Raman-Nath configuration in which opposing diffraction orders have equal intensity. In this regard, opposing diffraction orders may be simultaneously captured using two symmetric illumination poles.

Additional embodiments of the present disclosure are directed to sequentially positioning one or more illumination poles at selected locations within an illumination pupil to sequentially illuminate a sample at different angles of incidence. For example, one or more diffraction gratings in a Raman-Nath configuration may be configured for sequential positioning of diffracted orders at different locations of an illumination pupil by changing the period of one or more of the gratings. By way of another example, a single source beam may be positioned at any location using one or more diffraction gratings in a Bragg configuration. In this regard, a single diffracted beam (e.g., a first-order diffracted beam) associated with each grating may be captured and directed to the sample. Accordingly, it is recognized herein that directing illumination from the illumination source into a single diffracted beam may provide high-brightness illumination. Further, the diffraction angle may be controlled by adjusting a drive frequency and/or a modulation amplitude of a tunable diffraction grating (e.g., an acousto-optic deflector, or the like). Any remaining undesired beams (e.g., a 0-order beam) may be blocked.

It is recognized herein that providing rapid adjustment of the illumination pupil (e.g., based on adjusting tunable diffraction gratings) may further facilitate efficient use of the output of the illumination source by reducing the number of illumination poles in use at a given time. For example, it may be desirable to provide illumination poles along two orthogonal directions to facilitate characterization of features of a sample oriented along any direction. Accordingly, sequentially illuminating the sample with high-brightness illumination poles along two orthogonal off-axis directions may provide faster and more accurate measurements than simultaneously illuminating the sample with multiple lower-brightness illumination poles along the two orthogonal off-axis directions (e.g., quadrupole illumination).

Additional embodiments of the present disclosure are directed generating at least one illumination pole to facilitate auto-focusing of a sample. It is recognized herein that the positions of diffracted beams from a sample in a collection pupil plane may be sensitive to the focal position of the sample (e.g., a position of the sample along an optical axis of an objective lens, or the like). Accordingly, one or more illumination poles may facilitate determination of the focal position of the sample before or during a measurement.

Additional embodiments of the present disclosure are directed to a scatterometry metrology system including a high-brightness tunable multi-pole illumination system. Accordingly, the high-brightness tunable multi-pole illumination system may facilitate rapid sequential measurements of a sample with different conditions. For example, such a scatterometry metrology system may generate sequential measurements with different distributions of illumination poles. By way of another example, such a scatterometry metrology system may generate sequential measurements with different wavelengths (e.g., for discrete spectral bands, over a swept spectral band, or the like). Further, the sequential measurements with different wavelengths may be generated using the same or different distributions of the illumination poles.

Referring now to FIGS. 1A through 8, a high-brightness tunable multi-pole illumination system 100 is disclosed in more detail.

FIG. 1A is a conceptual view of a tunable multi-pole illumination system 100, in accordance with one or more embodiments of the present disclosure. In one embodiment, the tunable multi-pole illumination system 100 includes an illumination source 102 to generate a source beam 104 and at least one tunable diffraction grating 106 to generate at least one illumination pole 108. In this regard, the illumination poles 108 may be formed from diffracted orders of the source beam 104.

In another embodiment, the tunable multi-pole illumination system 100 includes a controller 110. In another embodiment, the controller 110 includes one or more processors 112 configured to execute program instructions maintained on a memory medium 114. In this regard, the one or more processors 112 of controller 110 may execute any of the various process steps described throughout the present disclosure.

The one or more processors 112 of a controller 110 may include any processing element known in the art. In this sense, the one or more processors 112 may include any microprocessor-type device configured to execute algorithms and/or instructions. In one embodiment, the one or more processors 112 may consist of a desktop computer, mainframe computer system, workstation, image computer, parallel processor, or any other computer system (e.g., networked computer) configured to execute a program configured to operate the tunable multi-pole illumination system 100, as described throughout the present disclosure. It is further recognized that the term "processor" may be broadly defined to encompass any device having one or more processing elements, which execute program instructions from a non-transitory memory medium 114. Further, the steps described throughout the present disclosure may be carried out by a single controller 110 or, alternatively, multiple controllers. Additionally, the controller 110 may include one or more controllers housed in a common housing or within multiple housings. In this way, any controller or combination of controllers may be separately packaged as a module suitable for integration into tunable multi-pole illumination system 100.

The memory medium 114 may include any storage medium known in the art suitable for storing program instructions executable by the associated one or more processors 112. For example, the memory medium 114 may include a non-transitory memory medium. By way of another example, the memory medium 114 may include, but is not limited to, a read-only memory, a random access memory, a magnetic or optical memory device (e.g., disk), a magnetic tape, a solid state drive and the like. It is further noted that memory medium 114 may be housed in a common controller housing with the one or more processors 112. In one embodiment, the memory medium 114 may be located remotely with respect to the physical location of the one or more processors 112 and controller 110. For instance, the one or more processors 112 of controller 110 may access a remote memory (e.g., server), accessible through a network (e.g., internet, intranet and the like). Therefore, the above description should not be interpreted as a limitation on the present invention but merely an illustration.

In another embodiment, the controller 110 is communicatively coupled to one or more elements of the tunable multi-pole illumination system 100 to provide configuration information. For example, the controller 110 may be communicatively coupled to the illumination source 102 to control the spectrum of illumination incident on the sample (e.g., through one or more drive signals to the illumination source). By way of another example, the controller 110 may be communicatively coupled to one or more tunable diffraction gratings 106 to adjust the distribution of one or more illumination poles 108 (e.g., through one or more drive signals to the tunable diffraction gratings 106). In another embodiment, the controller 110 is communicatively coupled to a detector (not shown). In this regard, the controller 110 may receive signals from the detector (e.g., a collection pupil image, or the like). Further, the controller 110 may determine relative registration errors (e.g., overlay) of sample layers based on signals received from the detector.

In another embodiment, the controller 110 may generate sequential drive signals for any combination of elements in the tunable multi-pole illumination system 100 to facilitate sequential metrology measurements (e.g., by a detector of a system incorporating the tunable multi-pole illumination system 100). For example, the controller 110 may generate sequential drive signals to the tunable diffraction gratings 106 to facilitate sequential measurements with different distributions of illumination poles. By way of another example, the controller 110 may generate sequential drive signals to the tunable diffraction gratings 106 to facilitate sequential measurements with different wavelengths (e.g., for discrete spectral bands, over a swept spectral band, or the like). Further, the sequential measurements with different wavelengths may be generated using the same or different distributions of the illumination poles. For instance, the controller 110 may generate sequential drive signals to the illumination source 102 to generate illumination poles 108 having different wavelengths and also generate corresponding drive signals for the tunable diffraction gratings 106 to adjust the drive frequencies to compensate for the changing wavelengths while providing a consistent spatial distribution of illumination poles for the sequential measurements.

In another embodiment, the source beam 104 generated by the illumination source 102 has a narrow bandwidth. In this regard, the diffraction pattern of the illumination poles 108 by a sample (e.g., by an overlay metrology target on a sample) may have minimal chromatic variation. For example, the spectral width of the source beam 104 may be, but is not required to be, less than approximately 25 nm. In one instance, the spectral width of the source beam 104 is in the range of approximately 10 nm to approximately 20 nm. In another instance, the spectral width of the source beam 104 is less than approximately 5 nm.

The illumination source 102 may include any type of illumination source known in the art suitable for generating a source beam 104 having a narrow bandwidth. For example, the illumination source 102 may directly generate a narrow-band source beam 104. By way of another example, the illumination source 102 may include a broadband source generating broadband illumination and one or more spectral filters to generate a narrow-band source beam 104. Further, the source beam 104 may include one or more selected wavelengths of light including, but not limited to, vacuum ultraviolet radiation (VUV), deep ultraviolet radiation (DUV), ultraviolet (UV) radiation, visible radiation, or infrared (IR) radiation. In another embodiment, the illumination source 102 may include a spectrally-tunable illumination source to generate a source beam 104 having a tunable spectrum.

The illumination source 102 may include any type of illumination source suitable for providing a source beam 104 having wavelengths in a range suitable for metrology. In one embodiment, the illumination source 102 is a coherent illumination source providing a source beam 104 with a high degree of coherence (e.g., spatial coherence and/or temporal coherence). For example, the illumination source 102 may include, but is not limited to, a narrow-band laser source, a broadband laser source, a supercontinuum laser source, a white-light laser source, or the like. Additionally, the source beam 104 may be delivered from the illumination source 102 via any technique such as, but not limited to, free-space propagation, a single-mode fiber (e.g., a photonic crystal fiber, or the like), or a multi-mode fiber. However, it is recognized herein that the brightness of the illumination source 102 typically improves as the number of modes decreases.

In one embodiment, the illumination source 102 includes a tunable light source suitable for generating a narrow-band source beam 104 within a selected spectral range. For example, the illumination source 102 may include a tunable source configured to directly generate the tunable narrow-band source beam 104 such as, but not limited to, a tunable narrow-band laser. By way of another example, the illumination source 102 may include a broadband source configured to generate broadband illumination and a tunable spectral filter to generate the tunable narrow-band source beam 104.

The illumination source 102 may further produce a source beam 104 having any temporal profile. For example, the illumination source 102 may produce a continuous source beam 104, a pulsed source beam 104, or a modulated source beam 104.

Figure 1B:
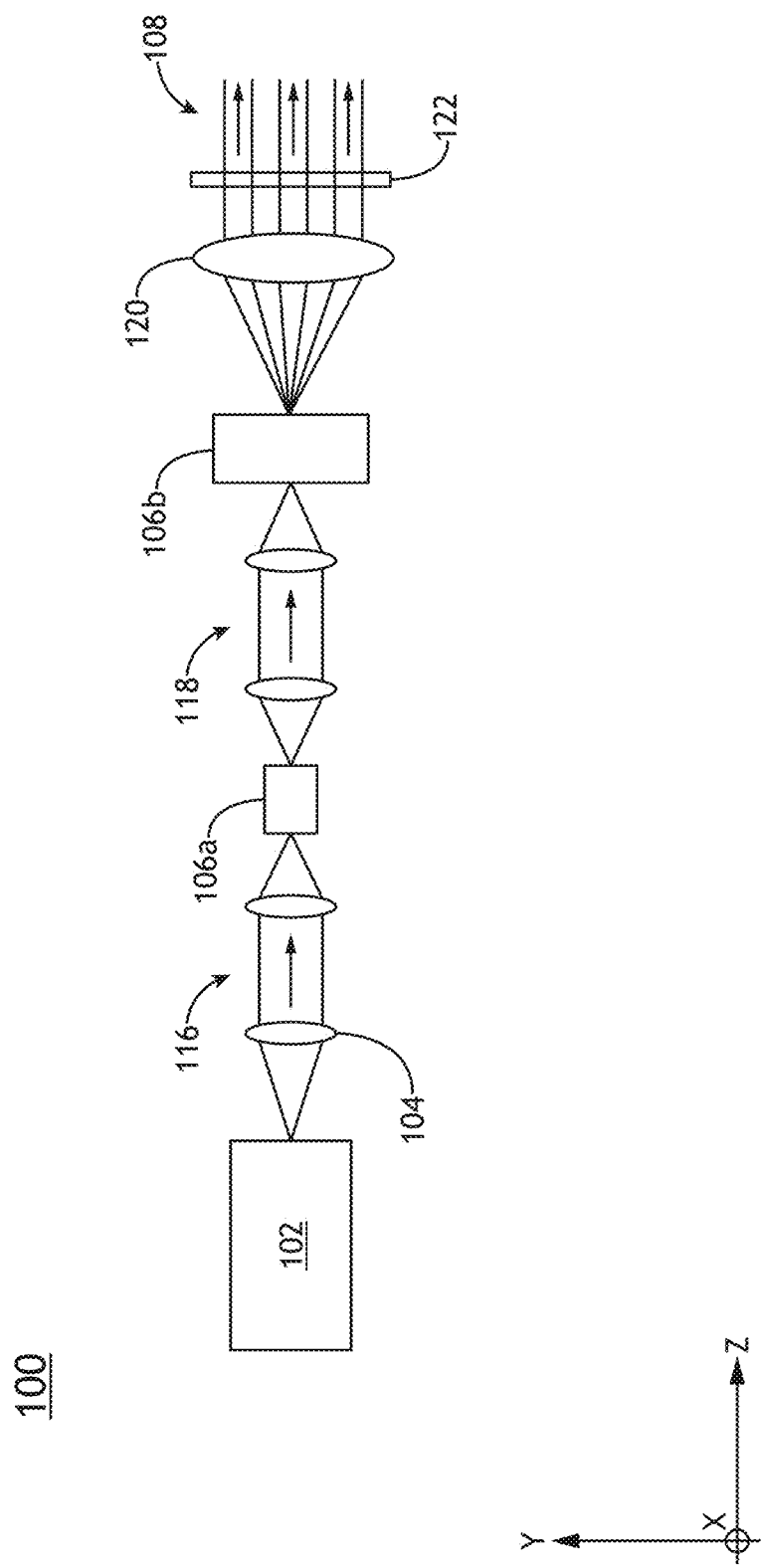
FIG. 1B is a conceptual view of a tunable multi-pole illumination system including two tunable diffraction gratings oriented to diffract beams along orthogonal axes, in accordance with one or more embodiments of the present disclosure.

The tunable multi-pole illumination system 100 may include any number of tunable diffraction gratings 106 to generate any number of illumination poles 108 in any distribution. FIG. 1B is a conceptual view of a tunable multi-pole illumination system 100 including two tunable diffraction grating 106 oriented to diffract beams along orthogonal axes, in accordance with one or more embodiments of the present disclosure. In one embodiment, the tunable multi-pole illumination system 100 includes a first tunable diffraction grating 106a oriented to diffract the source beam 104 into one or more diffraction orders distributed along a first direction (e.g., the X direction) and a second tunable diffraction grating 106b oriented to diffract the source beam 104 into one or more diffraction orders distributed along a second direction (e.g., the Y direction) orthogonal to the first direction. In this regard, illumination poles 108 may be directed to any selected positions within an illumination pupil to provide illumination on a sample at any incident angle.

The tunable multi-pole illumination system 100 may further include any type of tunable diffraction gratings 106 known in the art suitable for adjustably controlling the diffraction of the source beam 104. In one embodiment, a tunable diffraction grating 106 is formed from an AOD to diffract, position, and/or scan the source beam 104 to any selected position (e.g., in the X-Y plane of FIG. 1B, or the like). For example, an acousto-optic deflector may include a solid medium coupled with a transducer configured to generate ultrasonic waves that propagate through the solid medium. Properties of the solid medium such as, but not limited to, the refractive index may be modified by the propagating ultrasonic waves such that light (e.g., the source beam 104 or the like) is diffracted upon interaction with the solid medium. Furthermore, ultrasonic waves may propagate through the solid medium at the velocity of sound in the medium and have a wavelength related to the frequency of the drive signal as well as the velocity of sound in the solid medium. Accordingly, a modulation frequency and/or a modulation strength of a transducer may be dynamically adjusted (e.g., by drive signals generated by the controller 110, or the like) to modify the physical characteristics of the dynamically-generated diffraction grating and the corresponding dispersive properties (e.g., dispersion) of the AOD.

A tunable diffraction grating 106 formed from an AOD may further have any number of transducers coupled to the solid medium. In one embodiment, an AOD may include multiple transducers, each configured to generate ultrasonic waves and an associated grating pattern in different frequency ranges. In this regard, the AOD may be driven with frequencies outside the range of a single transducer. By way of another example, an AOD may include multiple transducers, each configured to generate ultrasonic waves along different directions. For instance, an AOD may include two transducers configured to generate ultrasonic waves along orthogonal directions. In this regard, a single AOD may generate illumination poles 108 distributed in a two-dimensional pattern.

The tunable multi-pole illumination system 100 may further include one or more optical elements to direct, focus, and/or collimate light. For example, the tunable multi-pole illumination system 100 may include a first set of optical elements 116 to collect the source beam 104 from the illumination source 102 and direct the source beam 104 on the first tunable diffraction grating 106a. Further, the first set of optical elements 116 may be selected to provide a desired spot size and focal volume (e.g., interaction length) in the first tunable diffraction grating 106a. By way of another example, the tunable multi-pole illumination system 100 may include a second set of optical elements 118 to collect one or more diffracted beams from the first tunable diffraction grating 106a and direct at least one of the diffracted beams to the second tunable diffraction grating 106b. Similarly, the second set of optical elements 118 may be selected to provide a desired spot size and focal volume (e.g., interaction length) in the second tunable diffraction grating 106b. By way of another example, the tunable multi-pole illumination system 100 may include a collimating lens 120 to collect and collimate at least some of the diffracted beams from the second tunable diffraction grating 106b as the illumination poles 108.

In another embodiment, the tunable multi-pole illumination system 100 includes one or more apertures 122 to block unwanted diffraction beams (e.g., +/−2 diffraction orders, unwanted +/−1 diffraction orders, unwanted 0 diffracted orders, or the like). For example, as illustrated in FIG. 1B, an aperture 122 may be located after the collimating lens 120. By way of another example, though not shown, an aperture 122 may be located between the first tunable diffraction grating 106a and the second tunable diffraction grating 106b to block unwanted diffraction prior to the second tunable diffraction grating 106b (e.g., to reduce stray light that may lead to noise in an illumination distribution). In one instance, an aperture 122 is located in the second set of optical elements 118. As described previously herein, it may be the case that a desired number and distribution of illumination poles 108 may be directly generated using one or more tunable diffraction gratings 106 such that apertures 122 may be unnecessary. However, it is recognized herein that even when one or more apertures 122 are utilized to block unwanted diffraction orders to achieve a desired illumination distribution, it may be the case that the tunable multi-pole illumination system 100 described herein may provide higher brightness (e.g., more efficient utilization of power from the illumination source 102) than generating illumination poles 108 by overfilling an aperture 122 having holes in selected locations.

In another embodiment, the tunable multi-pole illumination system 100 may include one or more apodizers to adjust the beam profile of one or more illumination poles 108. For example, an apodizer may gradually reduce the intensity of an illumination pole 108 relative to a central point to mitigate diffraction effects associated with diffraction of the illumination pole 108 with edges of an overlay metrology target. Further, apodizers may be, but are not required to be, integrated into one or more apertures 122. However, as described previously herein, it may be the case that illumination poles 108 generated through diffraction of the source beam 104 may require little or no apodization due to the Gaussian distribution of a source beam 104 generated by many illumination sources 102.

Figure 2:
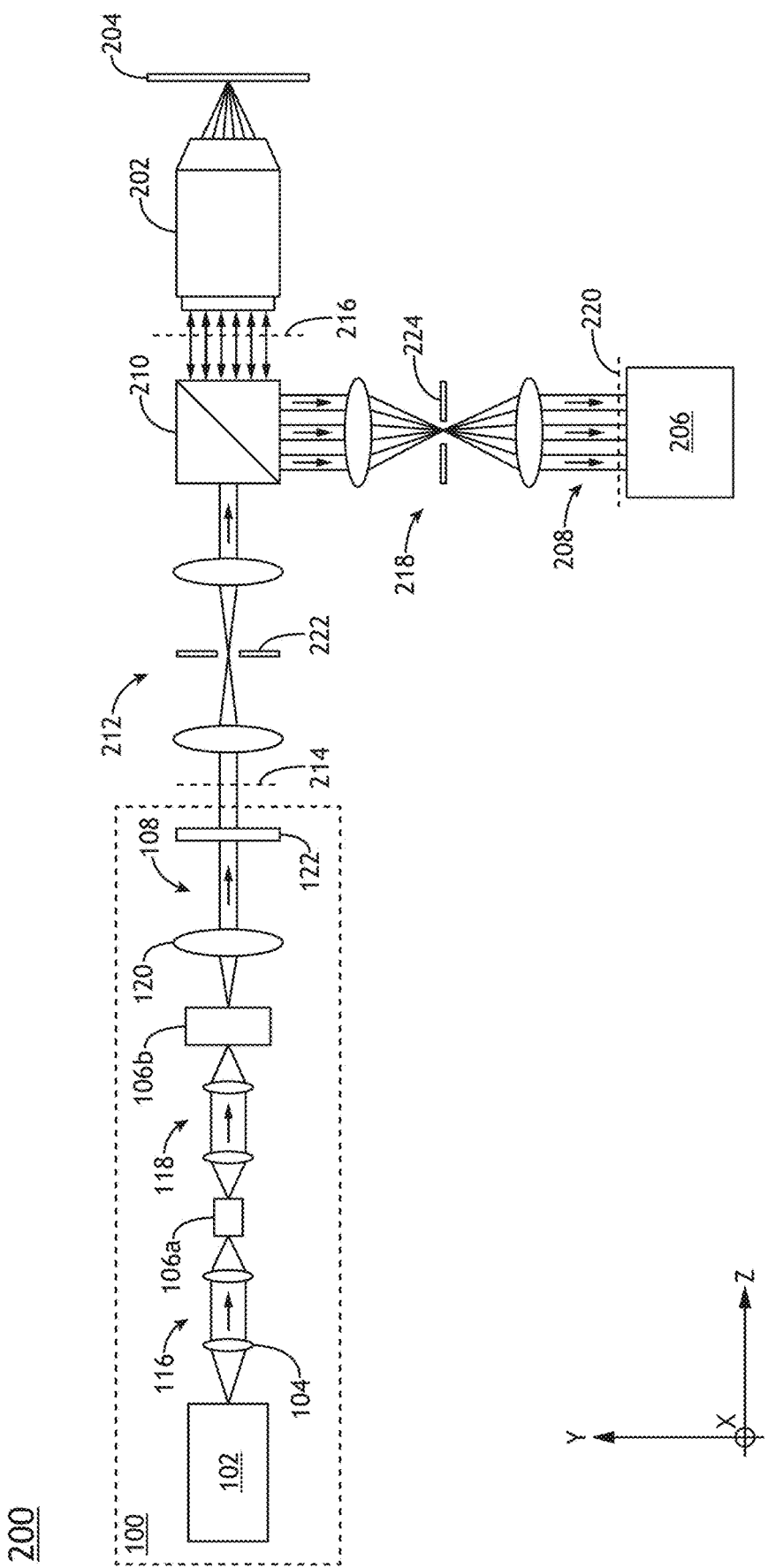
FIG. 2 is a conceptual view of a scatterometry metrology system, in accordance with one or more embodiments of the present disclosure.

Referring now to FIG. 2, the tunable multi-pole illumination system 100 may be incorporated into any type of external system to provide a selected distribution of illumination. FIG. 2 is a conceptual view of a scatterometry metrology system 200, in accordance with one or more embodiments of the present disclosure. In one embodiment, the scatterometry metrology system 200 includes an objective lens 202 to direct one or more illumination poles 108 from a tunable multi-pole illumination system 100 to a sample 204 (e.g., an overlay metrology target on the sample 204) and a detector 206 to capture return light 208 from the sample 204. For example, the detector 206 may be positioned at a pupil plane such that position on the detector 206 is representative of the angle at which the captured light emanates from the sample 204. Different diffraction orders of the return light 208 may be thus spatially separated on the detector 206. In this regard, the controller 110 may compare the intensities of opposing diffraction orders (e.g., +/−1 diffraction orders) generated by an overlay metrology target may be compared to determine overlay errors between sample layers.

In another embodiment, as illustrated in FIG. 2, the scatterometry metrology system 200 includes a beamsplitter 210. In this regard, the objective lens 202 may simultaneously direct the illumination poles 108 to the sample 204 and receive the return light 208 from the sample 204.

The scatterometry metrology system 200 may include additional optical elements to direct and/or condition light within the scatterometry metrology system 200. For example, the scatterometry metrology system 200 may include illumination relay lenses 212 to relay an illumination pupil 214 to the objective lens 202 (e.g., a back focal plane 216 of the objective lens 202). In this regard, the position of illumination poles 108 in the illumination pupil 214 may correspond to the angle of incidence of illumination on the sample 204. By way of another example, the scatterometry metrology system 200 may include collection relay lenses 218 to relay a collection pupil 220 to the objective lens 202 (e.g., the back focal plane 216 of the objective lens 202). In this regard, as described previously herein, the position on the detector 206 may correspond to the angle at which the return light 208 emanates from the sample 204. By way of a further example, the scatterometry metrology system 200 may include one or more stops (e.g., field stops, aperture stops, or the like). In one instance, as illustrated in FIG. 2, the scatterometry metrology system 200 may include an illumination field stop 222 to control the spatial extent of the illumination poles 108 on the sample 204 (e.g., to correspond to a size of an overlay target, or the like). In another instance, as also illustrated in FIG. 2, the scatterometry metrology system 200 may include a collection field stop 224 to control the spatial extent on the sample 204 from which return light 208 is collected.

A tunable multi-pole illumination system 100 may provide any selected distribution of illumination poles 108 suitable for illuminating a sample 204. Further, a tunable multi-pole illumination system 100 may sequentially provide multiple distributions of illumination poles 108 and/or illumination poles 108 including different wavelengths of light. In this regard, the tunable multi-pole illumination system 100 may facilitate the efficient capture of multiple measurements with different illumination conditions.

A tunable multi-pole illumination system 100 may provide a selected distribution of illumination poles 108 using any configuration of tunable diffraction gratings 106. For example, it is recognized herein that a tunable diffraction grating 106 formed from an acousto-optic deflector may be operated in multiple operational modes by adjusting the drive signals (e.g., drive frequency, or the like) and/or the alignment with respect to an incident beam.

In one embodiment, at least one tunable diffraction grating 106 is configured as an AOD in a Raman-Nath configuration. It is recognized herein that an AOD in a Raman-Nath configuration may typically accept an incident light beam from a wide range of incident angles and may split the incident light beam into multiple diffraction orders. Further, opposing diffraction orders (e.g., +/−1 diffraction orders, +/−2 diffraction orders, or the like) may typically have equal intensities, which may be beneficial for scatterometry overlay applications. In this regard, an AOD in a Raman-Nath configuration may be suitable for, but is not limited to, simultaneously providing symmetric illumination poles 108 arranged to illuminate the sample at opposing oblique angles for the simultaneous capture of opposing diffraction orders as described previously herein.

For example, as illustrated in FIG. 1B, the first tunable diffraction grating 106a and the second tunable diffraction grating 106b are both configured in a Raman-Nath configuration suitable for generating any selected distribution of illumination poles 108 in the X-Y plane. For instance, the first tunable diffraction grating 106a may diffract the source beam 104 into one or more diffraction orders distributed along the X direction, where the number and the spacing of the diffraction orders may be controlled by adjusting the drive frequency and/or modulation amplitude for the first tunable diffraction grating 106a. Additionally, the second tunable diffraction grating 106b may diffract at least some of the diffracted orders (e.g., a 0 diffraction order, +/−1 diffraction orders, +/−2 diffraction orders, or the like) from the first tunable diffraction grating 106a along the Y direction. Accordingly, a selected distribution of illumination poles 108 within the X-Y plane may be generated. Further, as described previously herein, an aperture 122 and/or an apodizer may be used to block unwanted diffraction orders and/or shape wanted diffraction orders.

In another embodiment, at least one tunable diffraction grating 106 is configured as an AOD in a Bragg configuration. It is recognized herein that an AOD in a Bragg configuration may typically direct at least a substantial portion of the intensity of an incident beam into single diffraction order. In some cases, a portion of the incident light may propagate as an undiffracted 0-order beam, which may be, but is not required to be, blocked by an aperture. In particular, incident light at or around a Bragg angle may be diffracted primarily into the single diffraction order based on constructive interference. The Bragg angle typically depends on both the wavelength of incident light and the period of a diffraction grating (e.g., related to the drive frequency of an AOD). Further, the drive frequency of an AOD associated with the Bragg condition is typically higher than drive frequencies associated with the Raman-Nath configuration.

An incident beam may thus be deflected, positioned, and/or scanned across a range of angles by orienting an AOD at the Bragg angle for a known wavelength of the source beam 104 and controlling the deflection angle by adjusting the drive frequency of the AOD within a range of values around the drive frequency associated with the Bragg condition. In this regard, an AOD in a Bragg configuration may be suitable for, but is not limited to, sequentially illuminating a sample with one or more illumination poles 108 associated with selected incidence angles for sequential capture of diffraction signals as described previously herein. For instance, an AOD in a Bragg configuration may be used to illuminate the sample at a first oblique angle to capture a first diffraction order and then illuminate the sample at an opposing oblique angle to capture an opposing diffraction order.

Figure 3A:
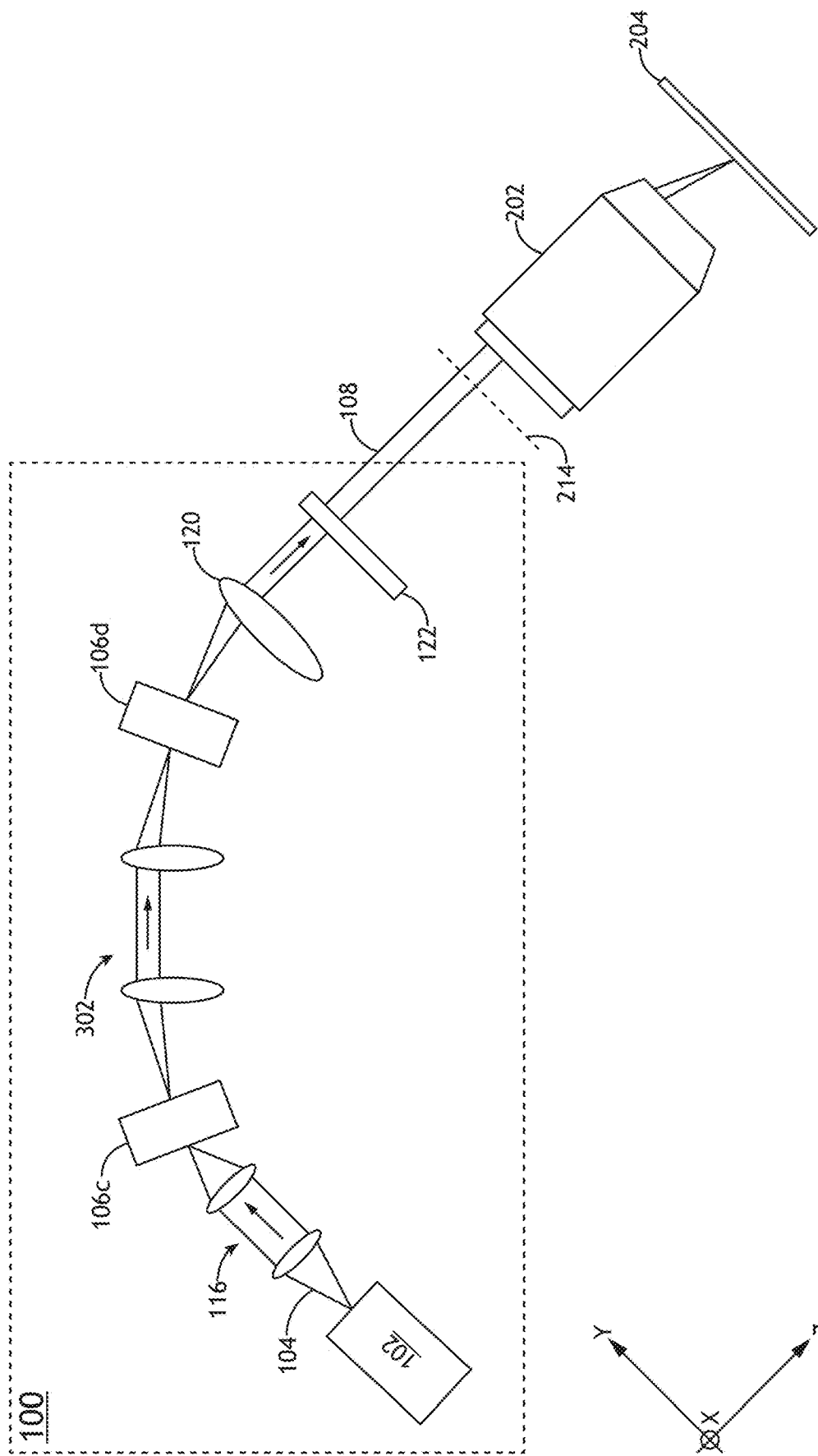
FIG. 3A is a conceptual view of a tunable multi-pole illumination system including two tunable diffraction gratings oriented in a Bragg configuration directing at least a portion of a source beam to a first position on a sample through an objective lens, in accordance with one or more embodiments of the present disclosure.
Figure 3B:
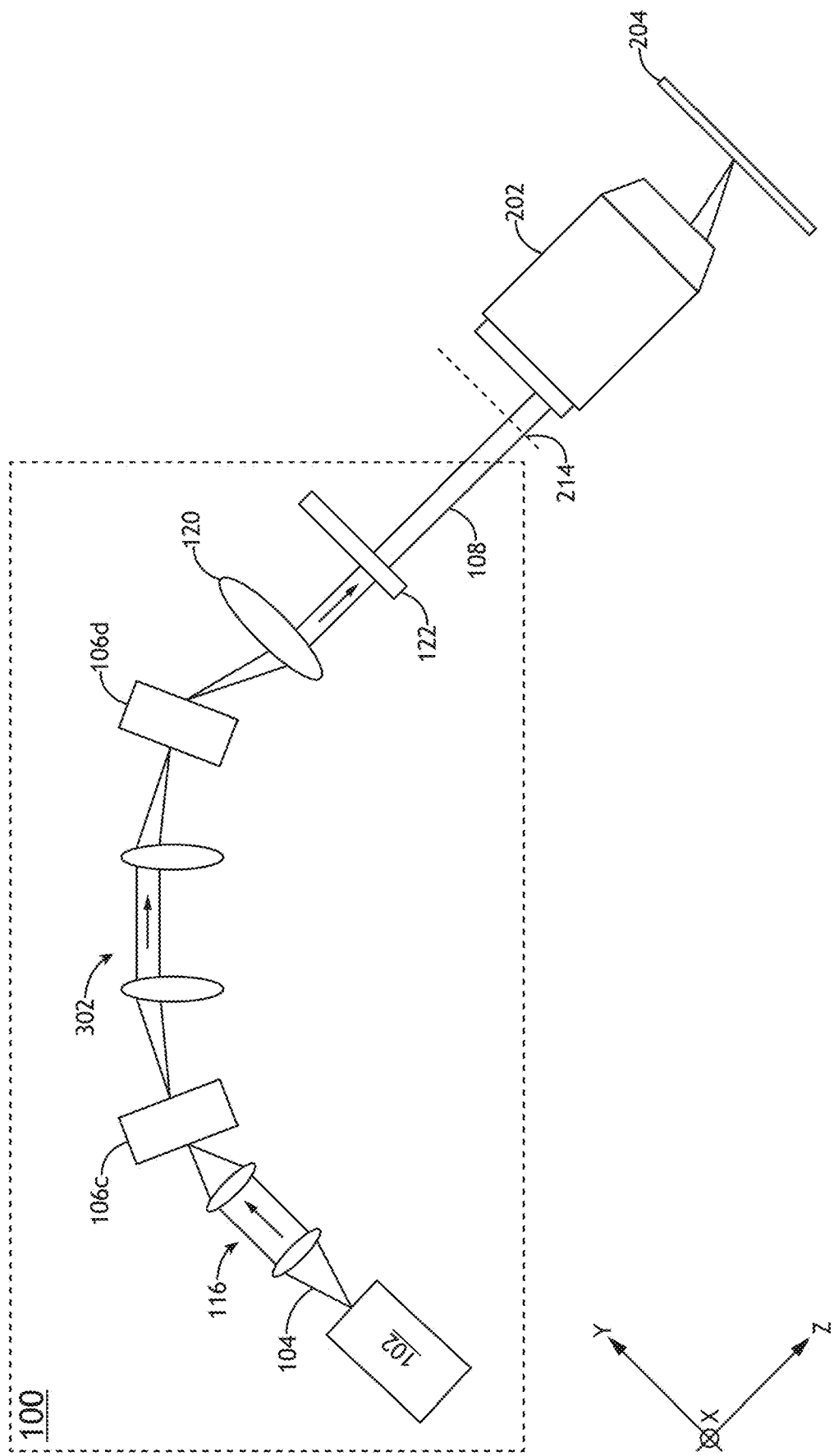
FIG. 3B is a conceptual view of a tunable multi-pole illumination system including two tunable diffraction gratings oriented in a Bragg configuration directing at least a portion of a source beam to a second position on a sample through an objective lens, in accordance with one or more embodiments of the present disclosure.

Referring now to FIGS. 3A and 3B, tunable diffraction gratings 106 in a Bragg configuration suitable for positioning incident light at selected locations along a single axis (e.g., the Y axis) are shown in greater detail. FIG. 3A is a conceptual view of a tunable multi-pole illumination system 100 including two tunable diffraction gratings 106 oriented in a Bragg configuration directing at least a portion of a source beam 104 to a first position on a sample 204 through an objective lens 202, in accordance with one or more embodiments of the present disclosure. FIG. 3B is a conceptual view of a tunable multi-pole illumination system 100 including two tunable diffraction gratings 106 oriented in a Bragg configuration directing at least a portion of a source beam 104 to a second position on a sample 204 through an objective lens 202, in accordance with one or more embodiments of the present disclosure. FIGS. 3A and 3B may correspond to a portion of the scatterometry metrology system 200 associated with illumination. In this regard, portions of the scatterometry metrology system 200 associated with collection and detection (e.g., the beamsplitter 210, the detector 206, or the like) are not shown for clarity.

It is recognized herein that the angular dispersion introduced to deflected light by an AOD in a Bragg configuration may differ as the deflection angle changes. However, in scatterometry metrology, it is typically desirable to provide consistent beam characteristics for all positions within an illumination pupil (e.g., the illumination pupil 214 of the scatterometry metrology system 200 of FIG. 2, or the like) to facilitate overlay determination based on comparisons of opposing diffraction orders generated by an overlay target. In one embodiment, as illustrated in FIGS. 3A and 3B, a tunable multi-pole illumination system 100 may include two tunable diffraction gratings 106c-d in Bragg configurations to deflect a source beam 104 along a selected axis. For example, the tunable multi-pole illumination system 100 may include a dispersing tunable diffraction grating 106c in a Bragg configuration to deflect the source beam 104 and a set of relay lenses 302 to relay the deflected beam to a de-dispersing tunable diffraction grating 106d in a Bragg configuration. In this regard, the de-dispersing tunable diffraction grating 106d may mitigate angular dispersion introduced by the dispersing tunable diffraction grating 106c.

The position of the deflected beam along an axis (e.g., the Y axis in FIGS. 3A and 3B) may be controlled by adjusting the drive frequencies of either the two tunable diffraction gratings 106c-d. For example, the dispersing tunable diffraction grating 106c may be configured to provide constant deflection at the Bragg condition and the de-dispersing tunable diffraction grating 106d may be used to position the deflected beam (e.g., the illumination pole 108). It is recognized herein that modifying the drive frequency to locate the illumination pole 108 at a location different than a nominal position associated with the Bragg configuration may result in residual angular dispersion in the illumination pole 108. However, it is further recognized herein that it may be desirable to provide radially symmetric illumination poles 108 for scatterometry overlay metrology. In one embodiment, the nominal position associated with the Bragg configuration is aligned to the center of the illumination pupil 214. In this regard, the angular dispersion of the illumination pole 108 may remain radially symmetric in the illumination pupil 214 suitable for scatterometry overlay metrology measurements.

Figure 3C:
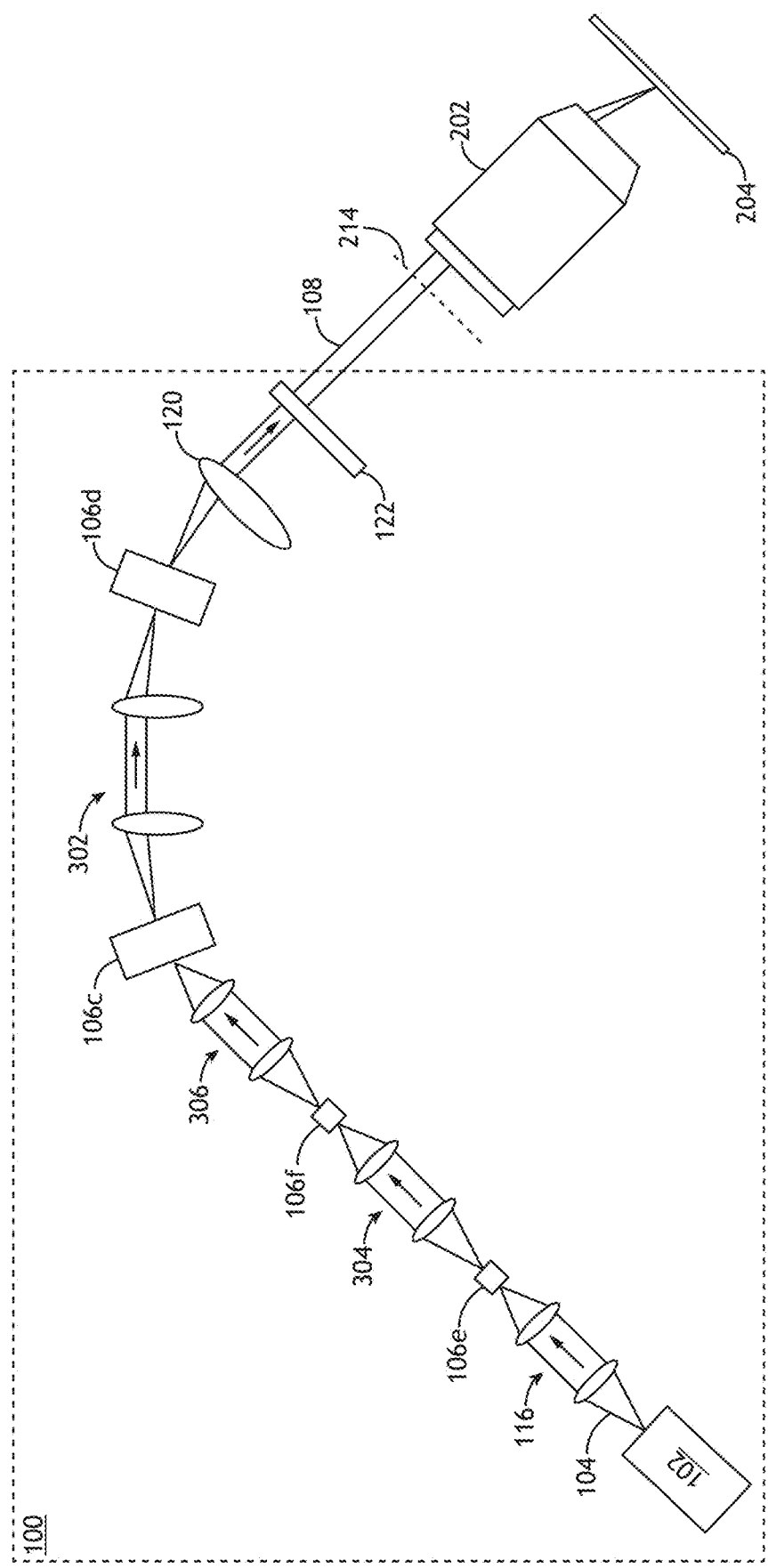
FIG. 3C is a conceptual view of a tunable multi-pole illumination system for positioning illumination poles at any position in an illumination pupil, in accordance with one or more embodiments of the present disclosure.

Additionally, it is to be understood that FIGS. 3A and 3B illustrate positioning illumination poles 108 at selected locations along a single direction (e.g., the Y axis). FIG. 3C is a conceptual view of a tunable multi-pole illumination system 100 for positioning illumination poles 108 at any position in an illumination pupil 214, in accordance with one or more embodiments of the present disclosure. In one embodiment, the tunable multi-pole illumination system 100 includes two tunable diffraction gratings 106e-f to position one or more illumination poles 108 along the X-direction in addition to the two tunable diffraction gratings 106c-d to position one or more illumination poles 108 along the Y-direction as illustrated in FIGS. 3A and 3B. In this regard, the two tunable diffraction gratings 106e-f may operate in substantially the same manner as the two tunable diffraction gratings 106c-d, but are rotated to position one or more illumination poles 108 along the X-direction. For example, the tunable multi-pole illumination system 100 may include a dispersing tunable diffraction grating 106e in a Bragg configuration to deflect the source beam 104 and a set of relay lenses 304 to relay the deflected beam to a de-dispersing tunable diffraction grating 106f in a Bragg configuration. In this regard, the de-dispersing tunable diffraction grating 106f may mitigate angular dispersion introduced by the dispersing tunable diffraction grating 106e. Accordingly, the dispersing tunable diffraction grating 106e may be configured to provide constant deflection at the Bragg condition and the de-dispersing tunable diffraction grating 106f may be used to position the deflected beam (e.g., the illumination pole 108). Further, an additional set of relay lenses 306 may direct the one or more illumination poles 108 from the tunable diffraction grating 106f to the tunable diffraction grating 106c. In this regard, the tunable multi-pole illumination system 100 position one or more illumination poles 108 at any selected locations in the illumination pupil 214.

Referring now to FIGS. 4 through 7B, a tunable multi-pole illumination system 100 may provide varied distributions of illumination poles 108 in an illumination pupil 214 with a high-brightness for efficient collection of any selected diffraction orders from a sample 204 (e.g., from an overlay metrology target on a sample 204).

FIG. 4 is a top view of an overlay metrology target 402 on a sample 204, in accordance with one or more embodiments of the present disclosure. In one embodiment, an overlay metrology target 402 suitable for scatterometry overlay metrology includes grating structures 404 oriented on multiple layers of interest of a sample 204 (e.g., a grating-on-grating target). The grating structures 404 may, but are not required to, overlap when the layers of interest are properly aligned without overlay errors. In FIG. 4, only grating structures 404 on a top layer are illustrated for clarity.

As described previously herein, scatterometry metrology typically involves determining registration errors between sample layers (e.g., overlay errors) based on a comparison of intensities of opposing diffraction orders (e.g., +/−1 diffraction orders). Further, the angle at which diffracted beams will emanate from the overlay metrology target 402 may depend on multiple factors including, but not limited to, the wavelength of an illumination pole 108, the angle of incidence of the illumination pole 108, and the period 406 of the grating structures 404. Accordingly, a tunable multi-pole illumination system 100 may provide an adjustable distribution of illumination poles 108 suitable for a wide range of illumination conditions.

FIGS. 5A through 7B illustrate non-limiting examples of configurations of illumination poles 108 in an illumination pupil 214 and associated diffracted orders of return light 208 in a collection pupil 220 that may be provided simultaneously or sequentially using a tunable multi-pole illumination system 100. Further, any of the configurations of illumination poles 108 in an illumination pupil 214 and associated diffracted orders of return light 208 in a collection pupil 220 in FIGS. 5A through 7B may be generated for any selected wavelength.

Figure 5B:
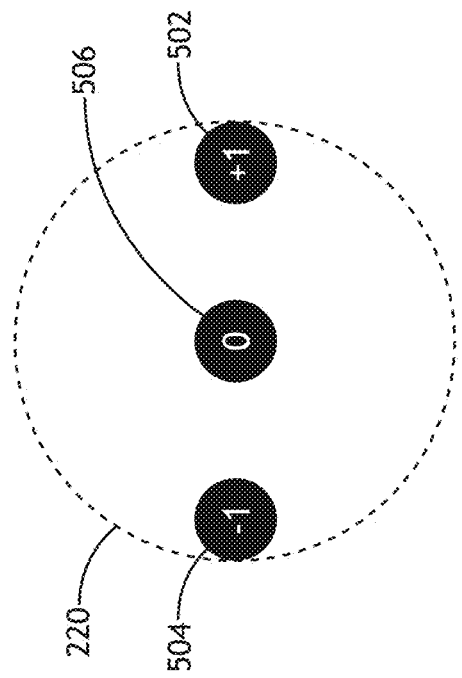
FIG. 5B is a top view of a collection pupil associated with return light from the overlay metrology target of FIG. 4 in response to the illumination pupil of FIG. 5A, in accordance with one or more embodiments of the present disclosure.
Figure 5A:
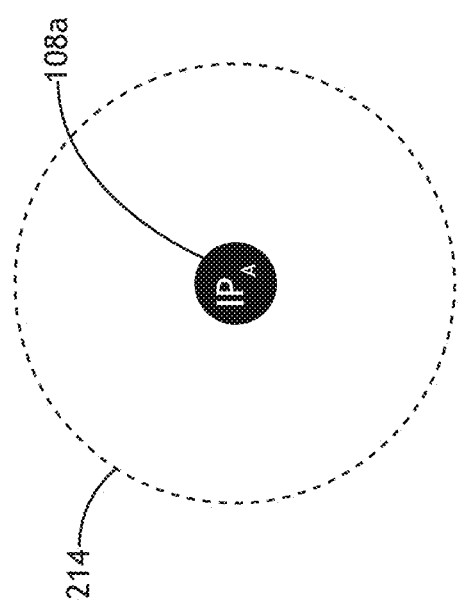
FIG. 5A is a top view of an illumination pupil including a single centrally-located illumination pole for normal illumination, in accordance with one or more embodiments of the present disclosure.

FIG. 5A is a top view of an illumination pupil 214 including a single centrally-located illumination pole 108a for normal illumination, in accordance with one or more embodiments of the present disclosure. FIG. 5B is a top view of a collection pupil 220 associated with return light 208 from the overlay metrology target 402 of FIG. 4 in response to the illumination pupil 214 of FIG. 5A, in accordance with one or more embodiments of the present disclosure. In one embodiment, the wavelength of an illumination pole 108a, the angle of incidence of the illumination pole 108a, and the period 406 of the grating structures 404 may be selected to provide simultaneous capture of a +1 diffraction order 502 and an opposing −1 diffraction order 504, as well as any undiffracted 0-order light 506, in the collection pupil 220 in response to normal illumination. For example, the conditions illustrated in FIGS. 5A and 5B may typically be associated with relatively shorter illumination wavelengths and/or relatively longer values of the period 406.

FIG. 6A is a top view of an illumination pupil 214 including two illumination poles 108b-c symmetrically positioned along edges of the illumination pupil 214 for oblique illumination, in accordance with one or more embodiments of the present disclosure. FIG. 6B is a top view of a collection pupil 220 associated with return light 208 from the overlay metrology target 402 of FIG. 4 in response to the illumination pupil 214 of FIG. 6A, in accordance with one or more embodiments of the present disclosure. In one embodiment, the wavelength of an illumination pole 108, the angle of incidence of the illumination pole 108, and the period 406 of the grating structures 404 may not be suitable for capturing of opposing +1 and −1 diffraction orders from a single illumination pole. For example, the conditions illustrated in FIGS. 6A and 6B may typically be associated with relatively longer illumination wavelengths and/or relatively shorter values of the period 406.

Accordingly, two symmetric illumination poles 108b-c distributed along the grating direction of the overlay metrology target 402 may be used to capture the opposing diffraction orders. For example, the collection pupil 220 may include 0-order diffraction 602 and a −1 diffraction order 604 associated with the illumination pole 108b, along with 0-order diffraction 606 and a +1 diffraction order 608 associated with the illumination pole 108c. Further, as described herein, the tunable multi-pole illumination system 100 may provide the illumination poles 108b-c either simultaneously or sequentially for corresponding simultaneous or sequential capture of the associated diffraction orders.

In some embodiments, the tunable multi-pole illumination system 100 may provide one or more illumination poles 108 for the purpose of determining the focal position of the sample 204 in addition to and/or instead of determining overlay measurements. For example, positions of return light 208 in the collection pupil 220 in response to oblique illumination may be indicative of the focal position.

Figure 7B:
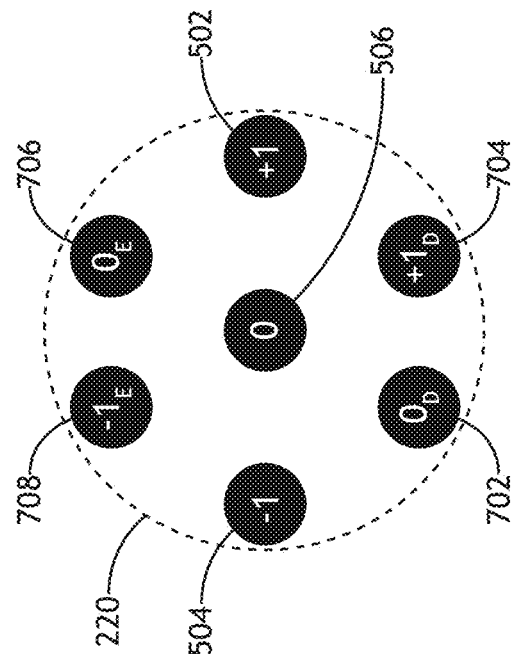
FIG. 7B is a top view of a collection pupil associated with return light from the overlay metrology target of FIG. 4 in response to the illumination pupil of FIG. 7A, in accordance with one or more embodiments of the present disclosure.
Figure 7A:
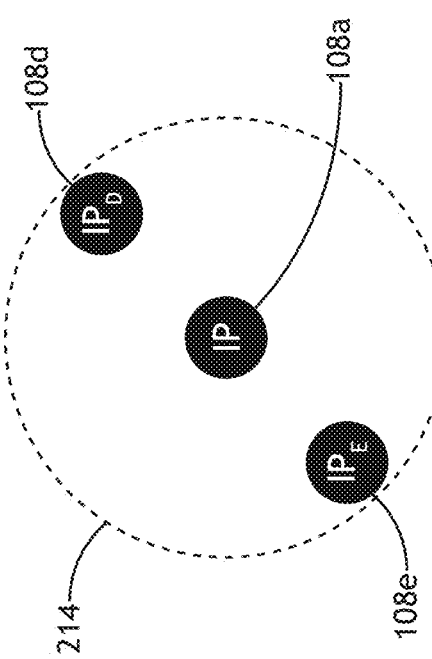
FIG. 7A is a top view of an illumination pupil including a single centrally-located illumination pole for normal illumination and two offset illumination poles for focal position determination, in accordance with one or more embodiments of the present disclosure.

FIG. 7A is a top view of an illumination pupil 214 including a single centrally-located illumination pole 108a for normal illumination and two offset illumination poles 108d-e for focal position determination, in accordance with one or more embodiments of the present disclosure. FIG. 7B is a top view of a collection pupil 220 associated with return light 208 from the overlay metrology target 402 of FIG. 4 in response to the illumination pupil 214 of FIG. 7A, in accordance with one or more embodiments of the present disclosure. In one embodiment, the +1 diffraction order 502 and the opposing −1 diffraction order 504 may be captured in the collection pupil 220 as illustrated in FIGS. 5A and 5B. In another embodiment, the collection pupil 220 may include undiffracted 0-order light 702 and a +1 diffraction order 704 associated with the first autofocus illumination pole 108d, along with undiffracted 0-order light 706 and a −1 diffraction order 708 associated with the second autofocus illumination pole 108e. Accordingly, distribution of illumination poles 108a,d-e in the illumination pupil 214 of FIG. 7A may facilitate determination of both overlay measurements and the focal position of the sample.

It is to be understood that FIGS. 4 through 7B are provided solely for illustrative purposes and should not be interpreted as limiting. For example, any illumination pole 108a-e may be provided simultaneously or sequentially. For instance, simultaneous illumination with multiple illumination poles 108 may be provided with, but is not limited to, a tunable multi-pole illumination system 100 including one or more tunable diffraction gratings 106 formed from AODs in a Raman-Nath configuration. Similarly, sequential illumination with multiple illumination poles 108 may be provided with, but is not limited to, a tunable multi-pole illumination system 100 including one or more tunable diffraction gratings 106 formed from AODs in a Bragg configuration. Further, a tunable multi-pole illumination system 100 may include multiple tunable diffraction gratings 106 formed from AODs in any combination of Raman-Nath and Bragg configurations.

By way of another example, FIGS. 5A through 7B illustrate examples of an illumination pupil 214 and a corresponding collection pupil 220 based on the single overlay metrology target 402 of FIG. 4 oriented with the grating structures 404 along the X direction. It is recognized herein that the tunable multi-pole illumination system 100 may include overlay metrology targets oriented along any direction (e.g., the Y direction of FIG. 4). In this regard, the distributions of light in the illumination pupil 214 may be correspondingly rotated along any direction. Further, as described previously herein, the tunable multi-pole illumination system 100 may include multiple grating structures such as, but not limited to those illustrated in FIG. 4, oriented with periodicity along different directions. In this regard, the tunable multi-pole illumination system 100 may provide illumination poles 108 at any selected location in the illumination pupil 214.

It is to be further understood that the overlay metrology target 402 of FIG. 4 is itself provided solely for illustrative purposes and does not limit the tunable multi-pole illumination system 100 or a metrology system incorporating the tunable multi-pole illumination system 100 (e.g., the scatterometry metrology system 200 in FIG. 2, or the like). Rather, the tunable multi-pole illumination system 100 is not limited for use with any particular type of overlay metrology target.

Additionally, in some embodiments, a tunable multi-pole illumination system 100 may provide a distribution of illumination poles 108 suitable for multiple orientations of an overlay metrology target. For example, a tunable multi-pole illumination system 100 may provide a quadrupole illumination by applying drive frequencies to orthogonal tunable diffraction gratings 106 to simultaneously generate +/−1 diffraction orders as illumination poles 108. By way of another example, a tunable multi-pole illumination system 100 may provide rotated dipole illumination by applying drive frequencies to orthogonal tunable diffraction gratings 106 to direct two diffraction orders (e.g., two first-order diffraction beams) distributed along a diagonal between the positioning directions of the orthogonal tunable diffraction gratings 106.

Figure 8:
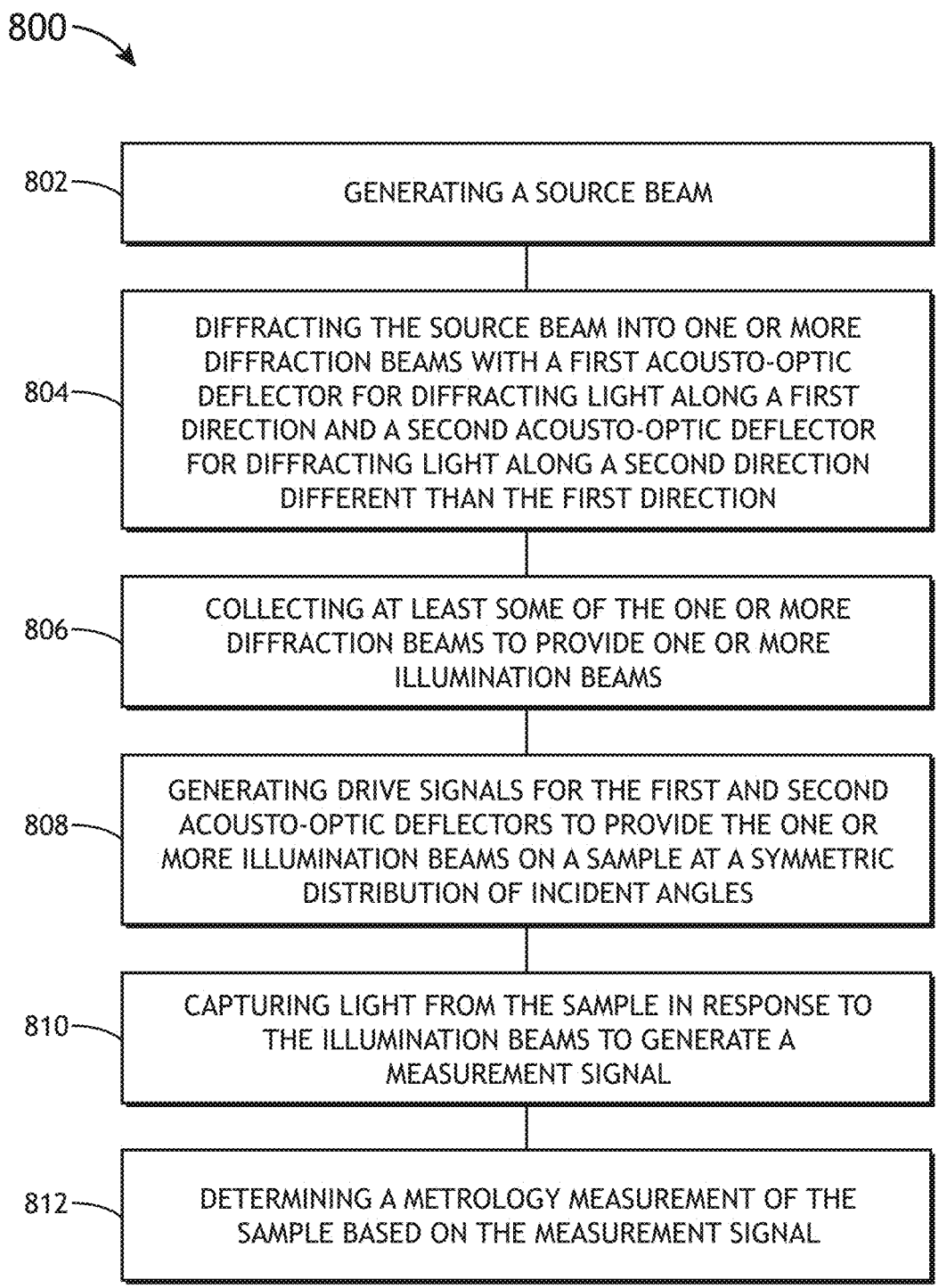
FIG. 8 is a flow diagram illustrating steps performed in a method for generating a high-brightness tunable multi-pole illumination.

FIG. 8 is a flow diagram illustrating steps performed in a method 800 for generating a high-brightness tunable multi-pole illumination. Applicant notes that the embodiments and enabling technologies described previously herein in the context of the tunable multi-pole illumination system 100 should be interpreted to extend to method 800. It is further noted, however, that the method 800 is not limited to the architecture of the tunable multi-pole illumination system 100.

In one embodiment, the method 800 includes a step 802 of generating a source beam. For example, the source beam may include a narrow bandwidth suitable for scatterometry overlay metrology.

In another embodiment, the method 800 includes a step 804 of diffracting the source beam into one or more diffraction beams with a first acousto-optic deflector for diffracting light along a first direction and a second acousto-optic deflector for diffracting light along a second direction different than the first direction. In this regard, the diffraction beams may be distributed in any two-dimensional pattern. Further, the first and second acousto-optic deflectors may be configured in any type of operational mode known in the art such as, but not limited to, a Raman-Nath configuration for simultaneously generating multiple diffraction orders or a Bragg configuration for deflecting, positioning, and/or scanning incident light.

In another embodiment, the method 800 includes a step 806 of collecting at least some of the one or more diffraction beams to provide one or more illumination beams. For example, one or more of the diffraction beams may be blocked by apertures.

In another embodiment, the method 800 includes a step 808 of generating drive signals for the first and second acousto-optic deflectors to provide the one or more illumination beams on a sample at a symmetric distribution of incident angles. For example, drive signals may be generated by one or more controllers to control the distribution of illumination poles in an illumination pupil, which may correspond to incident angles of illumination on the sample.

In another embodiment, the method 800 includes a step 810 of capturing light (e.g., return light) from the sample in response to the illumination beams to generate a measurement signal. For example, an overlay target on a sample may include grating structures on multiple layers of interest in a grating-over-grating configuration. A detector placed at a collection pupil may thus capture illumination from the illumination poles diffracted by the overlay target (e.g., return light).

In another embodiment, the method 800 includes a step 812 of determining a metrology measurement of the sample based on the measurement signal. For example, overlay may be determined by comparing the intensities of opposing diffraction orders (e.g., +/−1 diffraction orders, or the like) of the return light.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A multipole illumination system comprising:
   an illumination source configured to generate a source beam;
   one or more acousto-optic deflectors to diffract the source beam along at least a first direction and a second direction different than the first direction;
   one or more collection lenses to collect at least some of the diffracted light from the one or more acousto-optic deflectors; and
   a controller communicatively coupled to the one or more acousto-optic deflectors, the controller including one or more processors configured to execute program instructions causing the one or more processors to:
   generate one or more drive signals for the one or more acousto-optic deflectors, wherein the one or more drive signals cause the one or more acousto-optic deflectors to generate a symmetric distribution of two or more illumination beams formed from light diffracted from the one or more acousto-optic deflectors and collected by the one or more collection lenses, wherein a distribution of wavelength and intensity of the two or more illumination beams is symmetric in a plane formed by the first and second directions.

2. The multipole illumination system of claim 1, wherein the one or more drive signals cause the one or more acousto-optic deflectors to generate the two or more illumination beams simultaneously.

3. The multipole illumination system of claim 1, wherein the one or more drive signals cause the one or more acousto-optic deflectors to generate the two or more illumination beams sequentially.

4. The multipole illumination system of claim 1, wherein the symmetric distribution of the two or more illumination beams is radially symmetric.

5. The multipole illumination system of claim 1, wherein the symmetric distribution of the two or more illumination beams is symmetric with respect to at least one axis of symmetry in the plane formed by the first and second directions.

6. The multipole illumination system of claim 1, wherein the symmetric distribution of the two or more illumination beams is symmetric with respect to at least one of the first direction or the second direction.

7. The multipole illumination system of claim 1, wherein intensities of the two or more illumination beams are selectable based on intensities of the one or more drive signals to the first and second acousto-optic deflectors.

8. The multipole illumination system of claim 1, wherein locations of the two or more illumination beams in the plane formed by the first and second directions are selectable based on frequencies of the one or more drive signals to the one or more acousto-optic deflectors.

9. The multipole illumination system of claim 1, further comprising:
one or more apertures to block at least some light diffracted by at least one of the one or more acousto-optic deflectors.

10. The multipole illumination system of claim 1, wherein the symmetric distribution of the two or more illumination beams comprises:
at least one of two illumination beams arranged in a dipole distribution or four illumination beams arranged in a quadrupole distribution.

11. The multipole illumination system of claim 1, wherein the one or more acousto-optic deflectors are formed from two or more transducers and a common acoustic medium.

12. The multipole illumination system of claim 1, wherein at least one of the one or more acousto-optic deflectors is oriented in a Raman-Nath configuration to symmetrically diffract light.

13. The multipole illumination system of claim 1, wherein the one or more acousto-optic deflectors comprise:
a first acousto-optic deflector oriented to receive the source beam in a Raman-Nath configuration to symmetrically diffract light along the first direction; and
a second acousto-optic deflector oriented to receive light from the first acousto-optic deflector in a Raman-Nath configuration to symmetrically diffract light along the second direction.

14. The multipole illumination system of claim 1, wherein at least one of the one or more acousto-optic deflectors is oriented in a Bragg configuration.

15. The multipole illumination system of claim 1, wherein the one or more acousto-optic deflectors comprise:
a first acousto-optic deflector oriented to receive the source beam in a Bragg configuration;
a first aperture to selectively pass +/−1 diffraction orders distributed along the first direction from the first acousto-optic deflector; and
a second acousto-optic deflector oriented to receive at least one of the +/−1 diffraction orders from the first aperture in a Bragg configuration and diffract light along the first direction, wherein the second deflector at least partially corrects asymmetric dispersion from the first acousto-optic deflector.

16. The multipole illumination system of claim 15, wherein the one or more acousto-optic deflectors further comprise:
a third acousto-optic deflector oriented to receive the diffracted light along the first direction in a Bragg configuration and diffract the light along the second direction;
a second aperture to selectively pass +/−1 diffraction orders distributed along the second direction from the third acousto-optic deflector; and
a fourth acousto-optic deflector oriented to receive the +/−1 diffraction orders from the second aperture in a Bragg configuration and diffract light along the second direction, wherein the fourth acousto-optic deflector at least partially corrects asymmetric dispersion from the third deflector.

17. The multipole illumination system of claim 1, wherein the second direction is orthogonal to the first direction.

18. The multipole illumination system of claim 1, wherein the illumination source is spatially coherent.

19. The multipole illumination system of claim 1, wherein the wavelengths of the source beam from the illumination source are tunable.

20. The multipole illumination system of claim 1, wherein the illumination source includes a single-mode fiber.

21. The multipole illumination system of claim 20, wherein the single-mode fiber comprises:
a photonic crystal fiber.

22. The multipole illumination system of claim 1, wherein the illumination source comprises:
a laser source.

23. The multipole illumination system of claim 22, wherein the illumination source comprises:
a supercontinuum laser source.

24. The multipole illumination system of claim 1, wherein the illumination source comprises:
a broadband illumination source; and
a spectral filter.

25. An overlay metrology system comprising:
an illumination source configured to generate a source beam;
one or more acousto-optic deflectors to diffract light along a first direction;
an objective lens, wherein the objective lens directs at least some of the diffracted light as two or more illumination beams from the one or more acousto-optic deflectors to a sample;
a detector configured to capture light from the sample in response to the two or more illumination beams to generate a measurement signal; and
a controller communicatively coupled to the one or more acousto-optic deflectors and the detector, the controller including one or more processors configured to execute program instructions causing the one or more processors to:
generate one or more drive signals for the one or more acousto-optic deflectors, wherein the one or more drive signals cause the one or more acousto-optic deflectors to generate a symmetric distribution on the sample of the two or more illumination beams formed from light diffracted from the one or more acousto-optic deflectors and collected by the objective lens, wherein a distribution of wavelength and intensity of the two or more illumination beams is symmetric with respect to the first direction; and
determine a metrology measurement of the sample based on the measurement signal.

26. The overlay metrology system of claim 25, wherein the sample includes overlaid diffraction gratings on two or more sample layers, wherein the measurement signal includes a pupil plane signal, wherein the one or more processors are further configured to execute program instructions causing the one or more processors to:

determine overlay between the two or more sample layers based on the measurement signal.

27. The overlay metrology system of claim 25, wherein the one or more drive signals cause the one or more acousto-optic deflectors to generate the two or more illumination beams simultaneously.

28. The overlay metrology system of claim 25, wherein the one or more drive signals cause the one or more acousto-optic deflectors to generate the two or more illumination beams sequentially.

29. The overlay metrology system of claim 25, wherein intensities of the two or more illumination beams are selectable based on at least one of intensities or frequencies of the one or more drive signals to the first and second acousto-optic deflectors.

30. The overlay metrology system of claim 25, further comprising:
  one or more apertures to block at least some light diffracted by at least one of the one or more acousto-optic deflectors.

31. The overlay metrology system of claim 25, wherein the controller is further communicatively coupled to the illumination source, wherein the one or more processors are further configured to execute program instructions causing the one or more processors to:
  generate a first illumination drive signal to cause the illumination source to generate the source beam having a first spectrum;
  generate the drive signals for the one or more acousto-optic deflectors to provide a symmetric distribution of the one or more illumination beams on the sample based on the first spectrum;
  determine a first metrology measurement of the sample based on the first spectrum;
  generate a second illumination drive signal to cause the illumination source to generate the source beam having a second spectrum;
  generate the drive signals for the one or more acousto-optic deflectors to provide a symmetric distribution of the one or more illumination beams on the sample based on the second spectrum; and
  determine a second metrology measurement of the sample based on the second spectrum.

32. The overlay metrology system of claim 25, wherein at least one of the one or more acousto-optic deflectors is oriented in a Raman-Nath configuration to symmetrically diffract light.

33. The overlay metrology system of claim 25, wherein at least one of the one or more acousto-optic deflectors is oriented in a Bragg configuration.

34. The overlay metrology system of claim 25, wherein the one or more acousto-optic deflectors comprise:
  a single acousto-optic deflector.

35. The overlay metrology system of claim 25, wherein the one or more acousto-optic deflectors comprise:
  two or more acousto-optic deflectors placed in series.

36. A method for scatterometry overlay determination comprising:
  generating a source beam;
  diffracting the source beam along at least a first direction and a second direction different than the first direction with one or more acousto-optic deflectors;
  directing at least some of the diffracted light from the one or more acousto-optic deflectors as two or more illumination beams to a sample;
  generating one or more drive signals for the one or more acousto-optic deflectors to provide the two or more illumination beams on a sample at a symmetric distribution of incident angles, wherein a distribution of wavelength and intensity of the two or more illumination beams is symmetric with respect to the first and second directions;
  capturing light from the sample in response to the illumination beams to generate a measurement signal; and
  determining a metrology measurement of the sample based on the measurement signal.

* * * * *